(12) United States Patent
Wu et al.

(10) Patent No.: US 8,854,083 B2
(45) Date of Patent: Oct. 7, 2014

(54) SENSING AMPLIFIER USING CAPACITIVE COUPLING TO REALIZE DYNAMIC REFERENCE VOLTAGE

(71) Applicant: National Tsing Hua University, Hsinchu (TW)

(72) Inventors: Jui-Jen Wu, Hsinchu County (TW); Tun-Fei Chien, Kaohsiung (TW); Meng-Fan Chang, Taichung (TW); Yu-Der Chih, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 13/758,069

(22) Filed: Feb. 4, 2013

(65) Prior Publication Data

US 2014/0218110 A1 Aug. 7, 2014

(51) Int. Cl.
*G11C 7/00* (2006.01)
*H03F 3/45* (2006.01)

(52) U.S. Cl.
CPC .................................. *H03F 3/45076* (2013.01)
USPC .................................. 327/51; 327/52; 365/207

(58) Field of Classification Search
USPC ............................................................ 327/51
See application file for complete search history.

(56) References Cited

U.S. PATENT DOCUMENTS

| 7,821,859 | B1 * | 10/2010 | Raghavan | 365/208 |
| 2004/0178838 | A1 * | 9/2004 | Ngo et al. | 327/276 |
| 2008/0239834 | A1 * | 10/2008 | Tran et al. | 365/189.07 |
| 2011/0090745 | A1 * | 4/2011 | La Rosa | 365/189.09 |

* cited by examiner

*Primary Examiner* — Lincoln Donovan
*Assistant Examiner* — Patrick Chen
(74) *Attorney, Agent, or Firm* — Jackson IPG PLLC

(57) ABSTRACT

A sensing amplifier using capacitive coupling and a dynamic reference voltage, where the sensing amplifier circuit includes a bit line, configured to receive charging and discharging signals; a sensing amplifier, connected to the bit line and configured to receive the bit line and a reference voltage for comparison and configured to enlarge the voltage difference between a high point and a low point; and a reference voltage generator, connected to the sensing amplifier to generate the reference voltage required for the sensing amplifier to compare. The sensing amplifier effectively enhances sensing margin of the sensing amplifier circuit; and in addition, to accelerate the access speed, the sensing amplifier can easily determine the correct stored data and further quickly solve the problems of high-speed storing the data by the storage units.

1 Claim, 4 Drawing Sheets

SENSING AMPLIFIER USING CAPACITIVE COUPLING TO REALIZE DYNAMIC REFERENCE VOLTAGE

BACKGROUND OF THE INVENTION

1. Field of the Invention

The present invention relates to a sensing amplifier using capacitive coupling to realize a dynamic reference voltage, and more particularly to a sensing amplifier which effectively enhances the sensing margin of a sensing amplifier circuit; and in addition accelerates access speed. The sensing amplifier can easily determine the correct stored data and further quickly solve the problems of high-speed storing data by storage units.

2. Description of Related Art

With the rapid development of science and technology in the modern era, non-volatile memories, such as flash memory, have been widely used in a variety of electronic products. Traditionally, the stored data in a memory cell of the flash memory is read through a column decoder and a row decoder to a memory cell and applies with the memory a bias for comparison between the sensed current and a reference voltage through a sensing amplifier circuit which accordingly judges the stored data.

With the more advanced process technologies with increasingly high integration, the size of the supply voltage for the flash memory decreases accordingly so that the flash memory has lower power consumption and higher access speed.

However, since such a reduced supply voltage will lead to a lower sensing margin for the sensing amplifier circuit, so that the sensing amplifier circuit tends to make mistakes in determining the stored data. For such a problem encountered in processing data stored by storage units in a conventional sensing amplifier circuit, it is assumed that the sensing margin is 80 Mv. When it reads a 0, the bit line needs to reduce to 160 mV to ensure the success in sensing. The long sensing time causes the shortcoming of being time-consuming. The reduced sensing margin leads to less reading reliability. Furthermore, when it reads a 0, the data line (DL) drops and the mos N1 becomes weak, eventually making the $V_{REF}$ to increase. Even though the technology allows the DL to drop only to 80 mV through its feedback system and ensure success in sensing. However, the processing speed is not enough for the needs of high-speed reading. The needs of high-speed and effectively enhancing the accuracy of data sensing for the sensing amplifier circuit is still not met.

For this reason, the inventors has studied and proceeded in-depth discussion, and actively seek approaches for many years engaged in the research and experiences of related industries and manufacturing. After long-term research and efforts in development, the inventors have finally successfully developed this invention 'sensing amplifier using the capacitive coupling to realize the dynamic reference voltage' which overcomes the shortages in the prior art.

SUMMARY OF THE INVENTION

A main purpose of this invention is to provide a sensing amplifier with dynamic reference voltage which effectively enhances the sensing margin of a sensing amplifier circuit. In addition to accelerating the access speed, the sensing amplifier can easily determine the correct stored data and further quickly solve the problems of high-speed storing the data by storage units.

In order to achieve the above and other objectives, a sensing amplifier using capacitive coupling to realize a dynamic reference voltage according to the invention includes a bit line, used to receive charging and discharging signals; a sensing amplifier, connected to the bit line and used to receive the bit line and a reference voltage for comparison and enlarge the voltage difference between a high point and a low point; and a reference voltage generator, connected to the sensing amplifier to generate the reference voltage required for the sensing amplifier to compare.

In one embodiment, the sensing amplifier includes a first p-channel transistor, a second p-channel transistor, a third p-channel transistor, a four p-channel transistor, a fifth p-channel transistor, a sixth p-channel transistor, a first n-channel transistor, a second n-channel transistor and a third n-channel transistor, which are interconnected.

In one embodiment, the reference voltage comprises a seventh p-channel transistor, an eighth p-channel transistor, a ninth p-channel transistor, a 10th p-channel transistor, a capacitor and an inverter, which are interconnected.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended tables.

Figure 1:
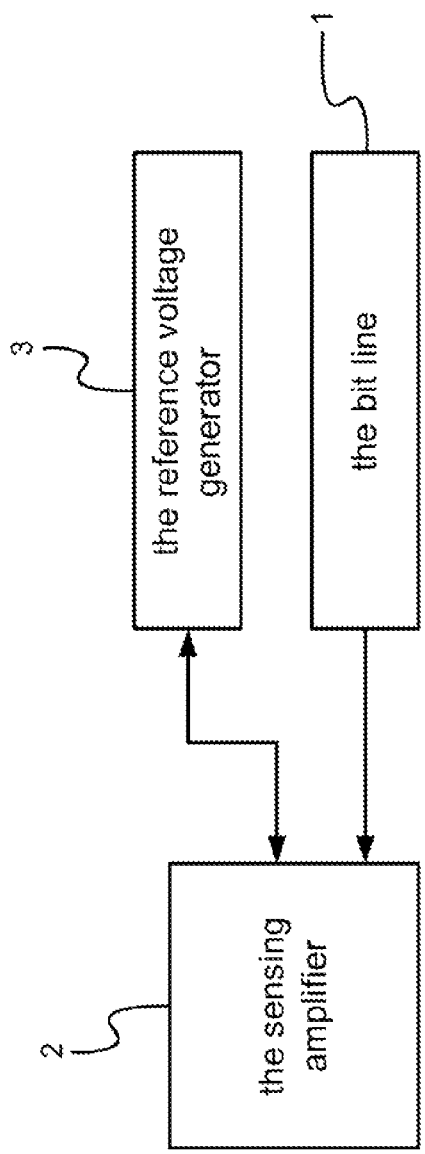
FIG. 1 is a schematic block diagram of a sensing amplifier using capacitive coupling to realize a dynamic reference voltage according to the invention.
Figure 2:
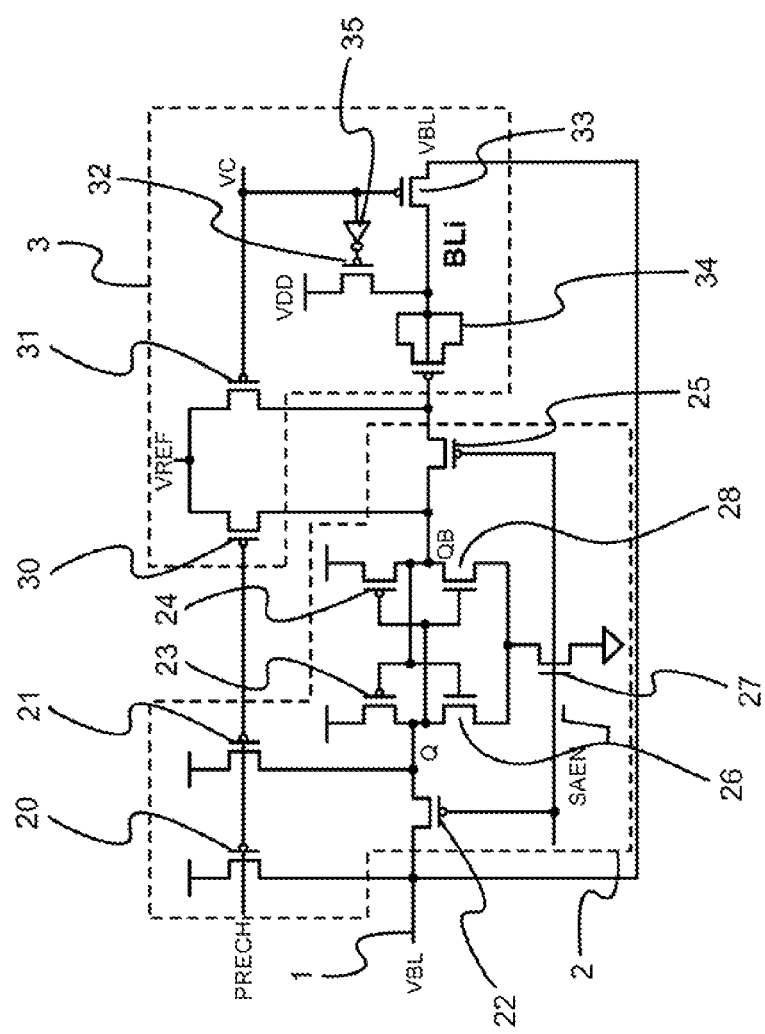
FIG. 2 is a schematic view of a reference circuit according to the invention.
Figure 3:
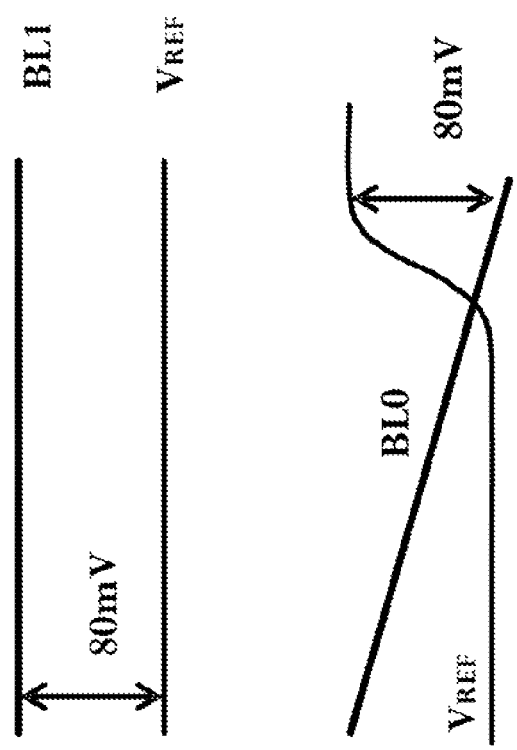
FIG. 3 is a schematic view of signal waves at operational stages according to the invention.
Figure 4:
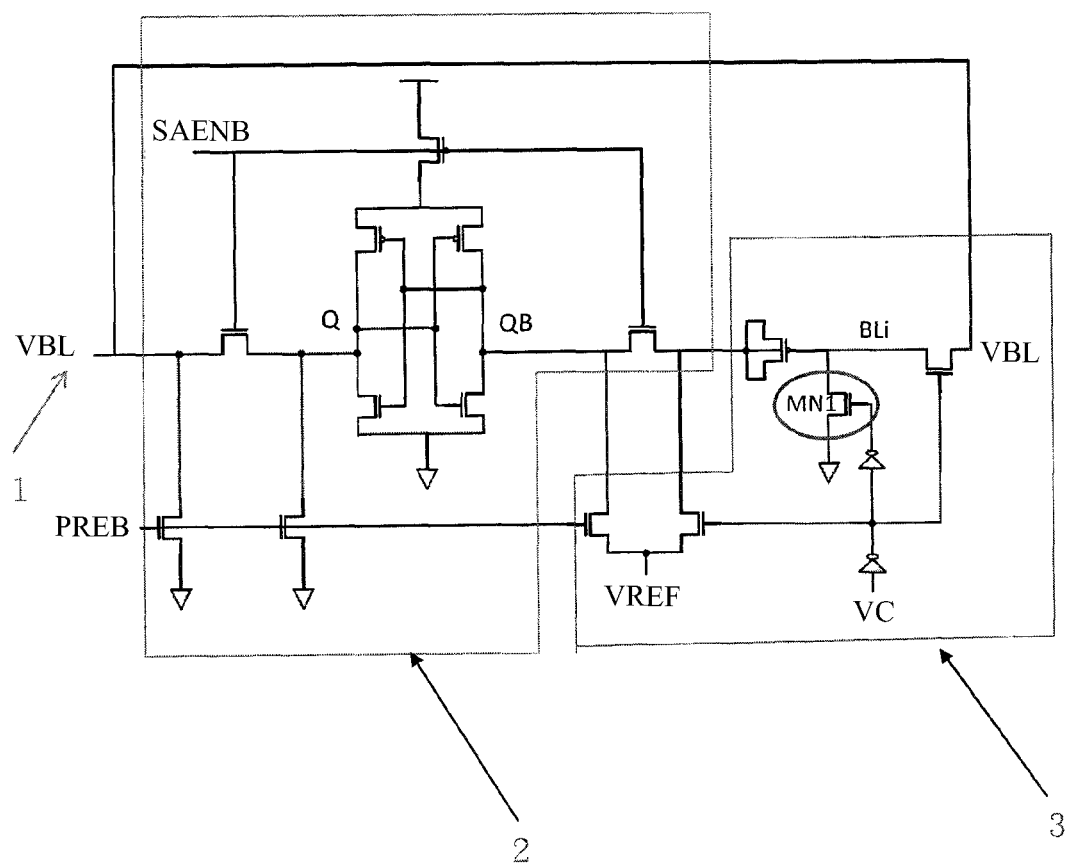
FIG. 4 is a schematic view of another reference circuit according to the invention.

FIG. 1 is a schematic block diagram of a sensing amplifier using capacitive coupling to realize a dynamic reference voltage according to the invention. FIG. 2 is a schematic view of a reference circuit according to the invention. FIG. 3 is a schematic view of signal waves at operational stages according to the invention. FIG. 4 is a schematic view of another reference circuit according to the invention. As shown, a sensing amplifier using capacitive coupling to realize a dynamic reference voltage according to the invention at least includes a bit line 1, a sensing amplifier 2, and a reference voltage generator 3.

Above mentioned bit line 1 is a bit line in the direction of an array column in a memory circuit configured to receive charging and discharging signals. When a memory cell is read, a bit line which is selected is subject to charging or discharging. A forward read means the action of discharging and a reverse read represents the action of charging. The forward read allows the bit line to go down from VDD, while the reverse read allows the bit line to rise from gnd.

The sensing amplifier 2 connects to the bit line 1. The sensing amplifier includes a first p-channel transistor 20, a second p-channel transistor 21, a third p-channel transistor 22, a fourth p-channel transistor 23, a fifth p-channel transistor 24, a sixth p-channel transistor 25, a first n-channel transistor 26, a second n-channel transistor 27 and a third n-channel transistor 28, which are interconnected. The sensing amplifier 2 is configured to receive the bit line 1 for comparison with a reference voltage and to enlarge the voltage difference between the high point and low point. When the voltage nodes Q, QB have sufficient voltage difference (one high and one low), the sensing amplifier 2 pulls away the node Q from the node QB so that the original high point is then pulled to VDD, and the original lower point is pulled to gnd. The bit line 1 and the reference voltage are input to the sensing amplifier for comparison. If the bit line 1 is higher than the reference voltage, it indicates read 1. If the bit line is lower than the reference voltage, it indicates read 0.

The reference voltage generator 3 is connected to the sensing amplifier 1, and includes a seventh p-channel transistor 30, an eighth p-channel transistor 31, a ninth p-channel transistor 32, a tenth p-channel transistor 33, a capacitor 34 and an inverter 35, which are interconnected and used to generate the required reference voltage for the comparison and determination operation of the sensing amplifier 2.

When the present invention is in use, the bit line 1, the operation of the sensing amplifier 2 and the reference voltage generator 3 are interconnected to one another as illustrated and operate as follows.

In FIG. 2, the bit line voltage-reference voltage (VBL-VREF) is stored in a capacitor 34. During the pre-charge stage, the node Q will be pre-charged to VDD and the node QB will be pre-charged to the reference voltage (VREF). While in operation, when the read value is 1, the bit line 1 is VDD and the node Q is VDD. When the ninth p-channel transistor 32 is turned on, the node BLi is still VDD and the node QB is VREF. When the read value is 0, the bit line 1 drops to the reference voltage (VREF) and the node Q is the reference voltage (VREF). When the ninth p-channel transistor 32 is turned on, the node BLi will be coupled to VDD and the node QB is also coupled to VDD. Therefore, when the read value is 0, the bit line 1 only need to drop to 80 mV to get the correct sensing data. Thereby, by means of the capacitive coupling to realize the dynamic VREF system, it is applicable to, for example, a one-time programmable (OTP) memory with larger sensing margin and can thus achieve high-speed and high-precision sensing performance. Furthermore, the reference circuit of the present invention may also be that as shown in FIG. 4 which can achieve the same effect.

In summary, the present invention uses capacitive coupling to achieve a sensing amplifier with dynamic reference voltage, effectively improving the shortcomings of the prior art and effectively enhancing the sensing margin of the sensing amplifier circuit. In addition, to accelerate access speed, the sensing amplifier can easily determine the correct stored data and further quickly solve the problems of high-speed storing data by storage units. This makes the invention more progressive and more practical in use which complies with the patent law.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:
1. A sensing amplifier circuit, comprising
a bit line, configured to receive charging and discharging signals and defining a bit line voltage (VBL);
a sensing amplifier comprising a first p-channel transistor, a second p-channel transistor, a third p-channel transistor connected to the bit line, a fourth p-channel transistor, a fifth p-channel transistor, a sixth p-channel transistor, a first n-channel transistor, a second n-channel transistor, and a third n-channel transistor wherein the second, third, and fourth p-channel transistors and the first n-channel transistors are mutually connected defining a node (Q) wherein the node Q is charged to an external VDD in a pre-charge stage of operation and wherein the sensing amplifier is connected to the bit line and configured to receive the bit line voltage and a dynamic reference voltage (VREF); and
a dynamic reference voltage generator comprising a seventh p-channel transistor, an eighth p-channel transistor, a ninth p-channel transistor connecting the bit line to VDD, a tenth p-channel transistor, a capacitor capacitively coupled to the bit line and VREF so as to store a voltage difference between VBL and VREF, and an inverter wherein the fifth, sixth, and seventh p-channel transistors and the third n-channel transistor are mutually connected defining a node (QB) wherein the node QB is charged to VREF in the pre-charge stage of operation and wherein the ninth and tenth p-channel transistors and the capacitor are mutually connected defining a node BLi wherein, in a read operation, when a read value is logic 1, VBL and the node Q is at VDD such that, when the ninth p-channel transistor is turned on, the node BLi is at VDD and the node QB is at VREF and, when the read value is logic 0, VBL drops to VREF and the node Q is at VREF and when the ninth p-channel transistor is turned on, the node BLi and the node QB are coupled to VDD.

* * * * *